United States Patent [19]

Sato

[11] Patent Number: 4,748,683
[45] Date of Patent: May 31, 1988

[54] ELECTRONIC TUNING TYPE FM RECEIVER

[75] Inventor: Kazuhiro Sato, Shinagawa, Japan

[73] Assignee: Sony Corporation, Tokyo, Japan

[21] Appl. No.: 12,669

[22] PCT Filed: Apr. 28, 1986

[86] PCT No.: PCT/JP86/00217
§ 371 Date: Dec. 30, 1986
§ 102(e) Date: Dec. 30, 1986

[87] PCT Pub. No.: WO86/06565
PCT Pub. Date: Nov. 6, 1986

[30] Foreign Application Priority Data

Apr. 30, 1985 [JP]  Japan ................................ 60-92807

[51] Int. Cl.$^4$ .................... H04B 11/16; H04B 1/10
[52] U.S. Cl. ................................ 455/164; 455/182; 455/192; 455/255
[58] Field of Search ............... 455/182, 183, 192, 196, 455/255, 256, 257, 258, 260, 264, 265, 164, 165, 296, 310–312

[56] References Cited

U.S. PATENT DOCUMENTS

| | | | |
|---|---|---|---|
| 4,127,822 | 11/1978 | Mogi et al. | 455/182 |
| 4,184,121 | 1/1980 | Tanaka | 455/182 |
| 4,222,121 | 9/1980 | Matsumoto et al. | 455/164 |
| 4,298,989 | 11/1981 | Someno et al. | 455/183 |
| 4,422,096 | 12/1983 | Henderson | 455/182 |
| 4,438,528 | 3/1984 | Itagaki | 455/164 |

Primary Examiner—Robert L. Griffin
Assistant Examiner—Curtis A. Kuntz
Attorney, Agent, or Firm—Hill, Van Santen, Steadman & Simpson

[57] ABSTRACT

An electronic tuning type FM receiver according to the present invention includes a first tuning control voltage generating circuit (11) for controlling the oscillation frequency of a local oscillator (7) for a high frequency amplifying circuit RA having tuning circuits (2) and (4), a frequency converting circuit (5), an intermediate frequency signal amplifying circuit (8), a demodulating circuit (9) and the frequency converting circuit (5). In this case, electronic tuning type FM receiver comprises a second tuning control voltage generating circuit (25) in which the tuning control voltage from the first tuning control voltage generating circuit (11) is altered in response to a detection output of the demodulating circuit (9) and then supplied to the tuning circuits (2) and (4) in the high frequency amplifying circuit RA whereby the tuning frequency thereof substantially follows a high frequency receiving frequency and a distortion of the high frequency receiving signal in the high frequency amplifying circuit RA is reduced.

3 Claims, 5 Drawing Sheets

ELECTRONIC TUNING TYPE FM RECEIVER

TECHNICAL FIELD

The present invention relates to an electronic tuning type FM receiver which comprises a tuning control voltage generating circuit for controlling the oscillation frequency of a local oscillator for a high frequency amplifying circuit having a tuning circuit, a frequency converting circuit, an intermediate frequency amplifying circuit, a demodulating circuit, and the frequency converting circuit.

BACKGROUND ART

A prior art electronic tuning type FM radio receiver will be described with reference to FIG. 7. A signal received by an antenna 1 is supplied to a high frequency amplifying circuit RA. This high frequency amplifying circuit RA is formed of high frequency tuning circuits 2 and 4 that are provided before and after a high frequency amplifier 3. Each of the high frequency tuning circuits 2 and 4 comprises, for example, a multiple tuning circuit and is formed of a pair of electromagnetically-coupled windings L1 and L2, a capacitor C connected in parallel thereto and a series circuit formed of a pair of voltage-controlled type variable capacity elements (varactor diodes) VC and connected in parallel to the respective winding. The high frequency signal from the high frequency amplifying circuit RA is supplied to a mixing circuit 6 which forms a frequency converting circuit 5. The intermediate frequency signal obtained from the mixing circuit 6 is supplied through an intermediate frequency signal amplifying circuit, that is, an intermediate frequency amplifying circuit 8 to a demodulating circuit, that is, a frequency detecting circuit 9. Reference numeral 10 designates an output terminal at which a frequency-detected output is developed. Reference numeral 7 designates a local oscillator which forms a part of the frequency converting circuit 5 and which includes a resonance circuit 7A which is formed of a winding L, a capacitor C connected in parallel thereto and a series circuit formed of a pair of voltage-controlled type variable capacitor elements (varactor diodes) VC and connected in parallel to the winding.

Reference numeral 11 designates a PLL (phase locked loop) employed as the tuning control voltage generating circuit and which comprises a reference oscillator 12, a phase comparator 13, a programmable frequency divider 14 and a low pass filter 15. The oscillation signal from the local oscillator 7 is supplied to the programmable frequency divider 14 and thereby divided by N. The signal thus frequency-divided and the reference signal from the reference oscillator 12 are supplied to the phase comparator 13 and thereby phase-compared. Then, the compared output is supplied to the low pass filter 15.

The tuning control voltage obtained from the low pass filter 15 is supplied to the cathodes of the respective voltage-controlled type variable capacity elements VC in the resonance circuit 7A of the local oscillator 7. Further, this tuning control voltage is supplied to the respective cathodes of the respective voltage-controlled type variable capacity elements VC of the respective high frequency tuning circuits 2 and 4 in the high frequency amplifying circuit RA.

In such electronic tuning type FM radio receiver, a channel selection frequency is determined by selecting the frequency-dividing ratio of the programmable frequency divider 14 in the PLL 11. In other words, when the frequency-dividing ratio of the programmable frequency divider 14 is altered, the oscillation frequency of the local oscillator 7 is altered and the center band pass frequencies of the high frequency tuning circuits 2 and 4 in the high frequency amplifying circuit RA are altered to become substantially coincident with the channel selection frequency.

In the above mentioned prior art electronic tuning type FM radio receiver, the center pass band frequencies of the high frequency tuning circuits 2 and 4 in the high frequency amplifying circuit RA are altered so as to become substantially coincident with the channel selection frequency, that is, the carrier frequency of the high frequency receiving signal. That is, with respect to the frequency characteristics of the high frequency amplifying circuits 2 and 4 as shown by a curve in FIG. 8, a carrier frequency f0 is coincident with the center band pass frequency thereof. Since this carrier signal is frequency-modulated by a modulation signal (audio signal), the high frequency receiving signal supplied to the high frequency amplifying circuit RA is changed around the frequency f0 from time to time. For example, when a momentary frequency thereof is f0−Δf, as illustrated in the figure, the frequency response in the high frequency amplifying circuit RA is lowered as compared with a case where the frequency is f0. Also, on the basis of the value Δf, the phase of the high frequency receiving signal is changed so that the high frequency receiving signal is distorted.

Accordingly, it is an object of this invention to provide an electronic tuning type FM receiver in which a high frequency receiving signal is not easily distorted in the high frequency amplifying circuit.

DISCLOSURE OF INVENTION

In an electronic tuning type FM receiver which comprises a first tuning control voltage generating circuit for controlling the oscillation frequency of a local oscillator for a high frequency amplifying circuit having a tuning circuit, a frequency converting circuit, an intermediate frequency signal amplifying circuit, a demodulating circuit and the frequency converting circuit, the electronic tuning type FM receiver of the present invention is characterized by a second tuning control voltage generating circuit in which the tuning control voltage from the first tuning control voltage generating circuit is altered dependent on the detection output of the demodulating circuit, supplied to the tuning circuit of the high frequency amplifying circuit RA and the tuning frequency thereof is controlled so as to substantially follow the high frequency receiving frequency.

According to the present invention as described above, since the center pass band frequency of the tuning circuit in the high frequency amplifying circuit RA substantially follows the frequency of the high frequency receiving signal, the amplitude characteristic of the output from the high frequency amplifying circuit becomes substantially flat and the phase characteristic thereof becomes substantially flat so that the distortion of the high frequency receiving signal in the high frequency amplifying circuit is reduced.

BEST MODE FOR CARRYING OUT THE INVENTION

Figure 1:
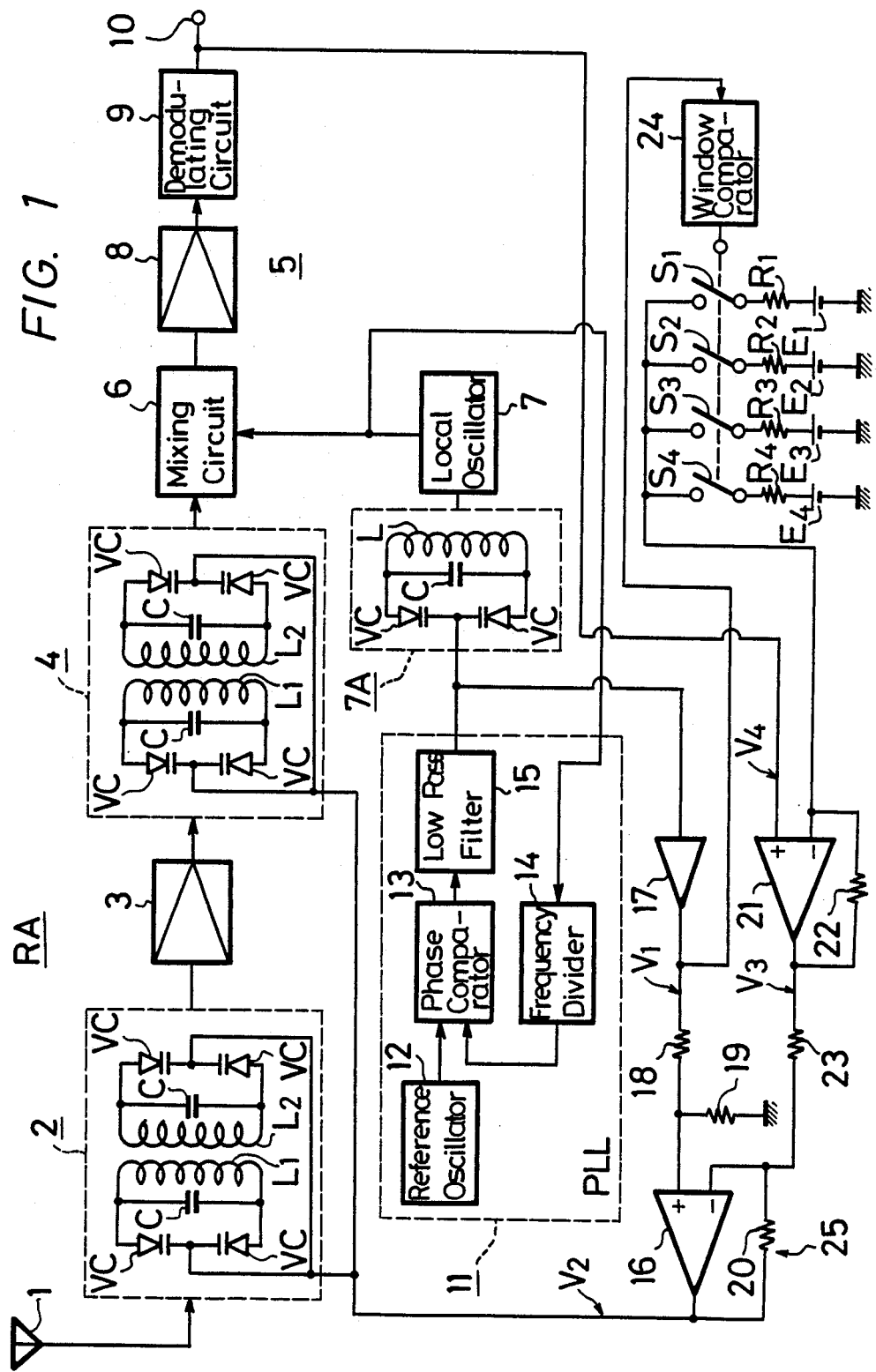
FIG. 1 is a circuit diagram showing an embodiment of the present invention.

An embodiment of the present invention will hereinafter be described with reference to FIG. 1. FIG. 1 shows an electronic tuning type FM radio receiver. A high frequency receiving signal from an antenna 1 is supplied to a high frequency amplifying circuit RA. This high frequecy amplifying circuit RA is formed of a high frequency amplifier 3 and high frequency tuning circuits 2 and 4 that are provided in the preceding and later stages thereof. The high frequency tuning circuits 2 and 4 are each formed of, for example, a multiple tuning circuit which comprises electromagnetically-coupled windings L1 and L2, a capacitor C connected in parallel thereto and a series circuit formed of a pair of voltage-controlled type variable capacity elements (varactor diodes) VC connected in parallel to the winding. The output from the high frequency amplifying circuit RA is supplied to a mixing circuit 6 which forms a frequency converting circuit 5. The intermediate frequency signal therefrom is supplied through an intermediate frequency signal amplifying circuit, that is, an intermediate frequency amplifying circuit 8 to a demodulating circuit 9 and thereby a detection output is developed at an output terminal 10. Reference numeral 7 designates a local oscillator which constructs the frequency converting circuit 5 and which includes a resonance circuit 7A formed of a winding L, a capacitor C connected in parallel thereto and a series circuit formed of a pair of voltage-controlled type variable capacity elements (varactor diodes) VC connected in parallel to the winding.

Reference numeral 11 designates a PLL (phase locked loop) employed as a first tuning control voltage generating circuit and which includes a reference oscillator 12, a phase comparator 13, a programmable frequency divider 14 and a low pass filter 15. The local oscillation signal from the local oscillator 7 is supplied to the frequency divider 14 and thereby frequency-divided by N. The frequency-divided output and the reference oscillation signal from the refernece oscillator 12 is supplied to the phase comparator 13 and thereby phase-compared and the compared output is supplied to the low pass filter 15. The tuning control voltage from this low pass filter 15 is supplied to the cathodes of the respective voltage-controlled type variable capacity elements VC in the resonance circuit 7A of the local oscillator 7.

Reference numeral 25 designates a tuning control voltage generating circuit which will be described hereinafter. The first tuning control voltage from the PLL 11 is applied through a buffer amplifier 17 to both ends of a series circuit formed of resistors 18 and 19. The voltage obtained at the junction between the resistors 18 and 19 is supplied to a non-inverting input terminal of an operational amplifier 16. A resistor 20 is connected between the output terminal and the inverting input terminal of the operational amplifier 16.

The detection output of the frequency detecting circuit 9, that is, the audio signal is supplied to a non-inverting input terminal of an operational amplifier 21. A resistor 22 is connected between the output terminal and the inverting input terminal of the operational amplifier 21. The output terminal of the operational amplifier 21 is connected through a resistor 23 to the inverting input terminal of the operational amplifier 16. The output from the buffer amplifier 17 is supplied to a window comparator 24 in which it is compared with, for example, 5 reference voltages. Then, the window comparator generates four kinds of compared outputs on the basis of the region of 5 reference voltages to which the above mentioned output belongs. The inverting input terminal of the operational amplifier 21 is grounded through respective series circuits formed of on-off switches S1 to S4, resistors R1 to R4 and DC power sources E1 to E4.

The tuning control voltage from the operational amplifier 16 is supplied to the cathodes of the respective voltage-controlled type variable capacity elements VC of the respective high frequency tuning circuits 2 and 4 in the high frequency amplifying circuit RA.

Next, the operation of this electronic tuning type FM radio receiver will be described. It is possible to select the channel by varying the frequency-dividing ratio of the programmable frequency divider 14 in the PLL circuit 11. That is, when the frequency-dividing ratio of the programmable frequency divider 14 is altered, the local oscillation frequency of the local oscillator 7 is altered and the tracking is carried out such that the center band pass frequencies of the respective high frequency tuning circuits 2 and 4 in the high frequency amplifying circuit RA becomes substantially coincident with the channel selection frequency, that is, the carrier frequency of the high frequency receiving signal.

By the way, since the relationship between the capacitance and the control voltage of the voltage-controlled type variable capacitor element (varactor diode) is non-linear, in the case of the tuning circuit using this voltage-controlled type variable capacitor element, as the tuning frequency becomes high, the control voltage deviation for obtaining the same frequency deviation becomes large. In other words, the control voltage is proportional to the square or to the cubic of the tuning frequency. Therefore, in view of such fact, the gain of the operational amplifier 21 will be altered by a step-by-step line approximation as follows. Specifically, the tuning control voltage from the buffer amplifier 17 is supplied to the window comparator 20 in which it is compared with, for example, five reference voltages Va, Vb, Vc, Vd and Ve (where Va<Vb<Vc<Vd<Ve). Then, on the basis of one of the four regions of these reference voltages Va to Ve to which the tuning control voltage belongs, the switches S1 to S4 are selectively closed and then the gain of the operational amplifier 21 is altered on the basis of the resistance values of the resistors R1 to R4. Thus, the detection output voltage of the detecting circuit 9 is corrected thereby so as to match the relationship between the tuning frequencies of the tuning circuits 2 and 4 and the control voltage with the above mentioned characteristic.

Further, in order that the center band pass frequencies (tuning frequencies) of the high frequency tuning circuits 2 and 4 may become substantially coincident with the channel selection frequency (the frequency of the carrier signal for the high frequency signal) within the reception frequency band (for example, 76 MHz to 90 MHz), the tuning control voltage from the buffer amplifier 17 is corrected by switching the DC voltage sources E1 to E4 in response to the corresponding voltage so as to alter the offset voltage of the operational amplifier 21.

In this case, V4 assumes the frequency-detected output voltage supplied to the non-inverting input terminal of the operational amplifier 21, V3 assumes the output voltage of the operational amplifier 21, V1 assumes the output voltage of the buffer amplifier 17 and V2 assumes the output voltage of the operational amplifier 16. Then, the gain of the operational amplifier 16 is controlled such that when V3=0, the equality V2=V1 is established.

Figure 4:
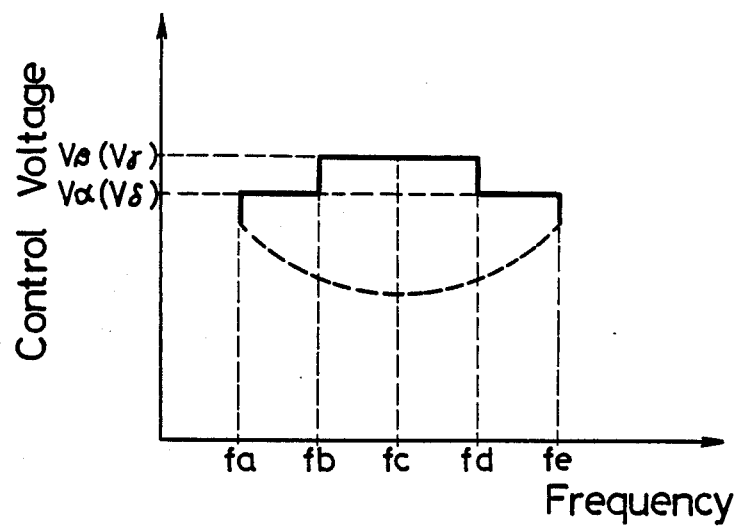
FIG. 4 is a graph graphing frequency characteristic of an output voltage from an operational amplifier 21.

If the frequency characteristic of the tracking error presented when the tuning control voltage from the PLL 11 is supplied directly to the respective voltage-controlled type variable capacity elements VC of the respective high frequency tuning circuits 2 and 4 contains a characteristic having, for example, a downward convexity as shown by a broken line in FIG. 4, it is sufficient that a control voltage supplied to each of the respective voltage-controlled type variable capacitor elements VC of the tuning circuits 2 and 4 may have a characteristic which is opposite thereto. Therefore, the high frequency receiving frequency range is selected to have a range of frequencies from fa to fe, and the range is equally divided into four ranges which are the, reference frequencies fa, fb, fc, fd and fe, which contain both ends of such divided range and which, are selected substantially average control voltages Vα, Vβ, Vγ and Vδ in the respective regions obtained by the above mentioned DC voltage sources E1 to E4. That is, a voltage having a frequency characteristic as shown by a solid line in FIG. 4 becomes the voltage V3 developed at the output side of the operational amplifier 21.

Figure 5:
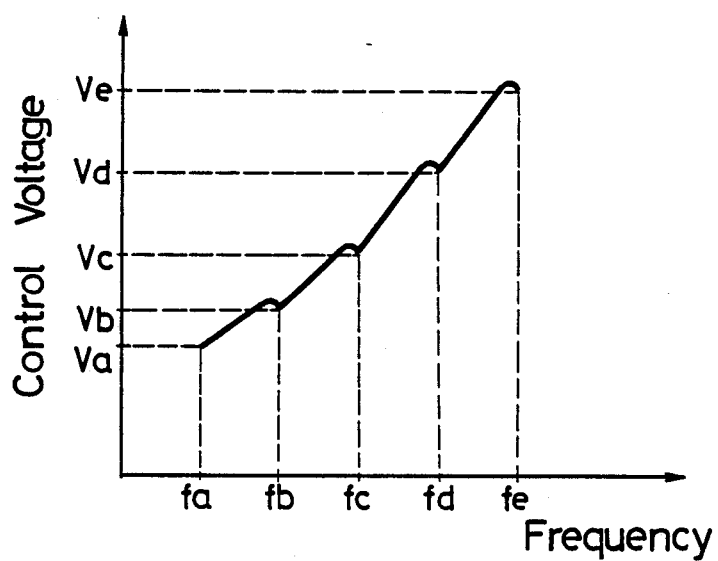
FIG. 5 is a graph graphing frequency characteristic of a tuning control voltage supplied to each voltage-controlled type variable capacity element in the high frequency tuning circuit.

The gain of the operational amplifier 21 is made to be different by the resistors R1 to R4 in the respective regions from the respective frequencies fa to fe, whereby the inclinations of the control voltages supplied to the respective voltage-controlled type variable capacitor elements VC of the tuning circuits 2 and 4 are made different. Accordingly, the tuning control voltage V2 having a frequency characteristic shown in FIG. 5 is developed at the output terminal of the operational amplifier 16 and is then supplied to the respective cathodes of the respective voltage-controlled type variable capacitor elements VC of the respective tuning circuits 2 and 4.

Alternatively, it may be possible that the respective switches are omitted, a single variable resistance element such as an FET and the like is employed instead of the respective resistors and a single variable DC voltage source is employed instead of the respective DC voltage sources, and the gain and the offset of the operational amplifier 21 are respectively varied continuously.

Figure 2:
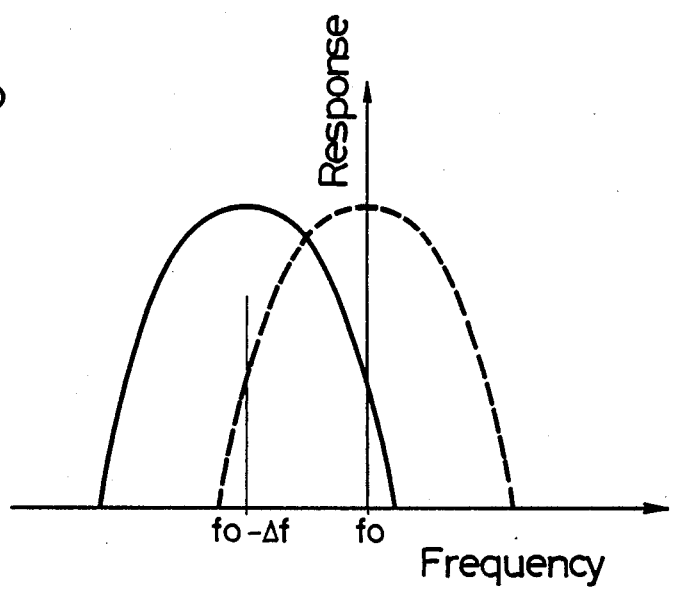
FIG. 2 is a graph graphing the relationship between the frequency characteristic of a high frequency tuning circuit and a frequency of a high frequency receiving signal.
Figure 3A:
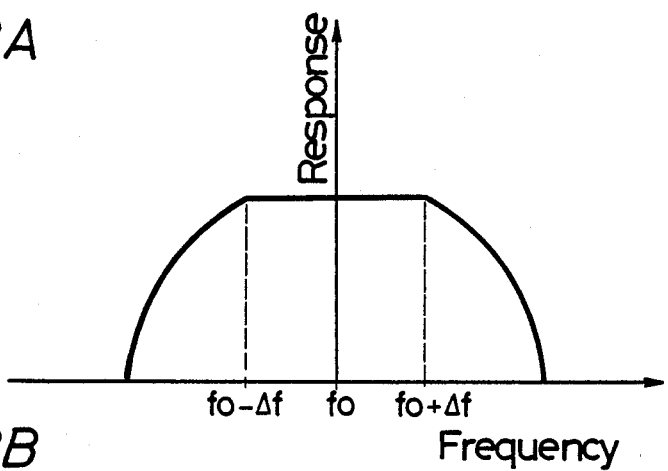
FIG. 3 is a graph graphing an amplitude frequency characteristic and a phase frequency characteristic in the high frequency tuning circuit.
Figure 3B:
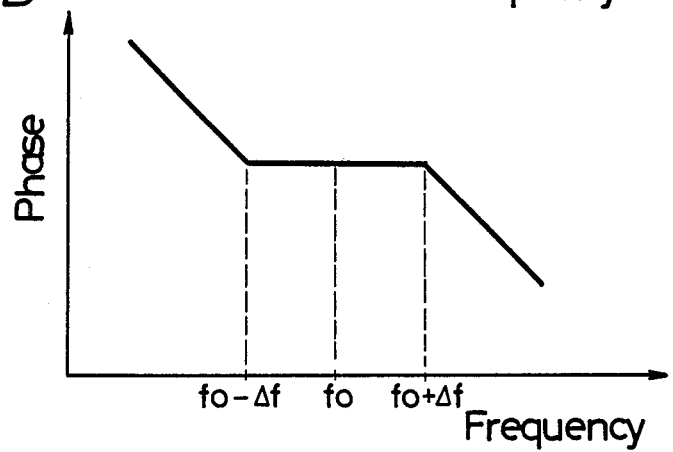

Accordingly, as shown in FIG. 2, in response to the receiving frequency f0−Δf of the high frequency receiving signal supplied to the high frequency amplifying circuit RA, the center pass band frequencies (tuning frequencies) of the tuning circuits 2 and 4 are altered so as to become substantially coincident with this frequency f0−Δf. As a result, as shown in FIG. 3A, the amplitude characteristic relative to the high frequency receiving frequency becomes substantially flat in a range between f0−Δf and f0+Δf where the maximum frequency deviation is selected as ±Δf. Further, as shown in FIG. 3B, the phase characteristic of the high frequency receiving signal becomes substantially flat in the range between f0−Δf and f0+Δf. Thus, the distortion of the high frequency receiving signal in the high frequency amplifying circuit RA is reduced considerably.

Furthermore, since the offset voltage of the operational amplifier 21 is altered in response to the value of the tuning control voltage from the above mentioned PLL 11, the high frequency tuning circuits 2 and 4 in the high frequency amplifying circuit RA can positively achieve tracking.

Figure 6:
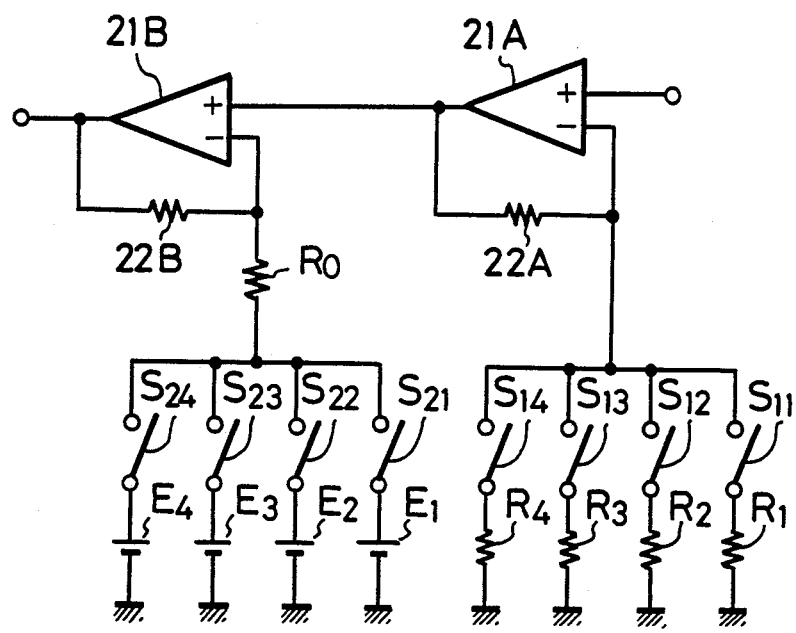
FIG. 6 is a circuit diagram showing one portion of another embodiment of the present invention.
Figure 8:
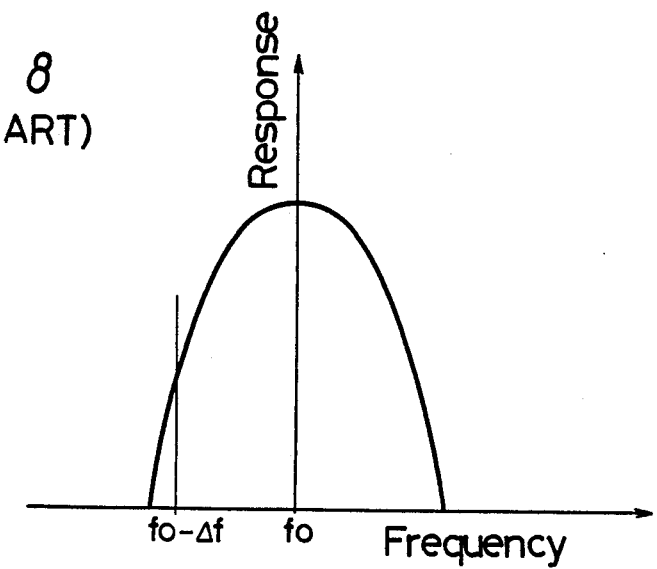
FIG. 7 is a circuit diagram of a prior art example and FIG. 8 is a graph graphing a relationship between a frequency characteristic of a high frequency tuning circuit and a high frequency receiving frequency in the prior art example.
Figure 7:
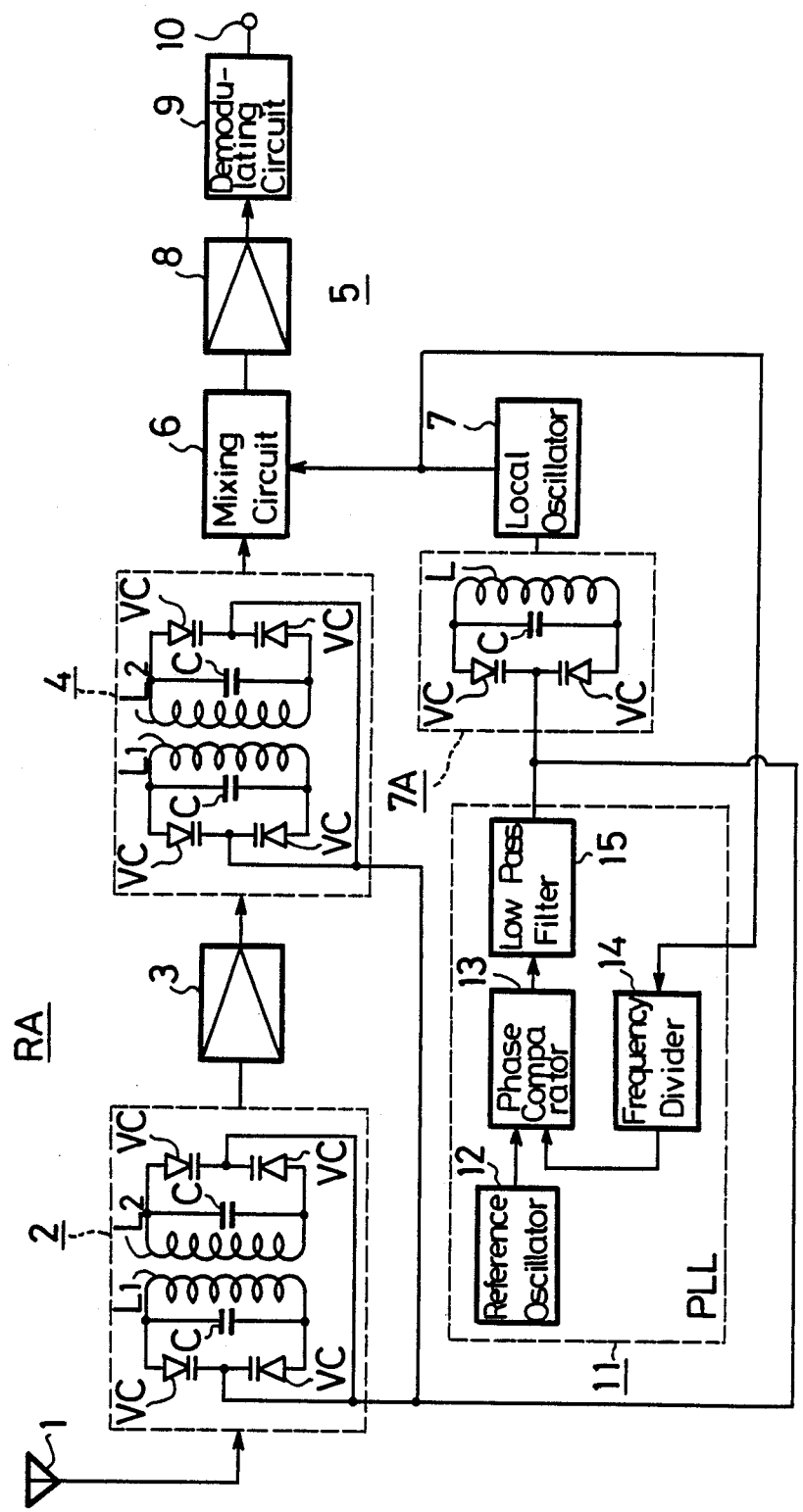

While in the above example, 4 series circuits formed of the on-off switches, the resistors and the DC power sources are connected in parallel between the inverting input terminal of the operational amplifier 21 and ground so as to simultaneously switch both the offset voltage and the gain of the operational amplifier 21 as described above, it may be possible that as shown in FIG. 6, there are provided two stages of operational amplifiers 21A and 21B, with resistors 22A and 22B connected respectively between the output terminals and the inverting input terminals thereof and, respective series circuits formed of on-off switches S11 to S14 and resistors R1 to R4 which are connected in parallel between the inverting input terminal of one operational amplifier 21A and ground while the respective series circuits of on-off switches S21 and S24 and DC power sources E1 to E4 are connected through a resistor R0 between the inverting input terminal of the other operational amplifier 21B and ground. Also in such case, this circuit can be operated similarly to the circuit of FIG. 1.

According to the present invention as described above, since the tuning frequency of the high frequency tuning circuit in the high frequency amplifying circuit substantially follows the high frequency receiving frequency, the distortion of the high frequency receiving signal in the high frequency amplifying circuit can be reduced.

I claim:

1. An electronic tuning type receiver comprising, a high frequency amplifying circuit (3) which receives the output of a tuning circuit (2) and having a voltage controlled type variable capacitance element (VC), a frequency converting circuit (6) which receives the output of said amplifying circuit, an intermediate frequency signal amplifying circuit (8) which receives the output of said frequency converting circuit, a demodulator circuit (9) which receives the output of said intermediate frequency signal amplifying circuit, a phase locked loop circuit (11), formed of a phase comparator 13, a reference oscillator (12) connected to said phase comparator (13), a programmable frequency divider (14) which supplies an input to said phase comparator and a low pass filter which receives the output of said phase comparator and the oscillation frequency of said frequency converting circuit is controlled by said programmable frequency divider, said electronic tuning type receiver including correcting voltage generating means (E1—E4:Si—S4) for correcting the non-linearity of a tuning control voltage versus capacitance characteristics of said voltage-controlled type variable capacitance element, first adding means (21) for receiving a demodulated audio frequency signal (V4) from said demodulating circuit and an output (E1 or E2 or E3 or E4) of said correcting voltage generating means, and second adding means (16) receiving the output (V3) of said first adding means and an output (V1), of said low pass filter in said phase locked loop whereby the center frequency of said tuning circuit (2) is varied in response to the demodulated audio frequency signal and at the same time the non-linearity of said variable capacitor element is compensated.

2. An electronic tuning type received according to claim 1 wherein said correcting voltage generating means includes a window comparator which receives an output from said low pass filter and controlling the output of said correcting voltage generating means.

3. An electronic tuning type receiver according to claim 2 wherein the gain of said first adding means is controlled by the output of said window comparator.

* * * * *